US012610626B2

(12) United States Patent
Zhang et al.

(10) Patent No.: US 12,610,626 B2
(45) Date of Patent: Apr. 21, 2026

(54) PHOTOVOLTAIC MODULE AND PREPARATION METHOD THEREFOR

(71) Applicant: TONGWEI SOLAR (HEFEI) CO., LTD., Hefei (CN)

(72) Inventors: Zhixun Zhang, Hefei (CN); Huaming Zhou, Hefei (CN); Gang Shi, Hefei (CN)

(73) Assignee: TONGWEI SOLAR (HEFEI) CO., LTD., Hefei (CN)

( * ) Notice: Subject to any disclaimer, the term of this patent is extended or adjusted under 35 U.S.C. 154(b) by 131 days.

(21) Appl. No.: 18/557,709

(22) PCT Filed: Apr. 28, 2022

(86) PCT No.: PCT/CN2022/089995
§ 371 (c)(1),
(2) Date: Oct. 27, 2023

(87) PCT Pub. No.: WO2023/108984
PCT Pub. Date: Jun. 22, 2023

(65) Prior Publication Data
US 2024/0222536 A1      Jul. 4, 2024

(30) Foreign Application Priority Data

Dec. 17, 2021    (CN) ......................... 202111552619.X

(51) Int. Cl.
*H10F 19/80*          (2025.01)
*H10F 19/90*          (2025.01)
*H10F 71/00*          (2025.01)
(52) U.S. Cl.
CPC ......... *H10F 19/804* (2025.01); *H10F 19/904* (2025.01); *H10F 71/128* (2025.01)
(58) Field of Classification Search
None
See application file for complete search history.

(56) References Cited

U.S. PATENT DOCUMENTS

| | | | | |
|---|---|---|---|---|
| 2007/0074755 | A1* | 4/2007 | Eberspacher | ......... H10F 77/939 136/244 |
| 2009/0114271 | A1* | 5/2009 | Stancel | ................... F24S 25/33 136/251 |

FOREIGN PATENT DOCUMENTS

| | | |
|---|---|---|
| CN | 109411559 A | 3/2019 |
| CN | 109786492 A | 5/2019 |

(Continued)

OTHER PUBLICATIONS

Engligh language machine translation of He et al. (CN 112864265 A). (Year: 2025).*

(Continued)

*Primary Examiner* — Eli S Mekhlin
(74) *Attorney, Agent, or Firm* — Dority & Manning, PA

(57) ABSTRACT

A photovoltaic module includes a cell string, transparent insulated flexible protectors, a front adhesive film, a back adhesive film, a first plate, a second plate. The cell string includes multiple cells. Adjacent cells are connected in series through multiple spaced welding ribbons. The area on the surface of each cell without the welding ribbons is a mounting portion. Adjacent cells are staggered vertically. The protector is arranged on the front or back side of each cell. The protector includes a first protective portion connected to the surface of the mounting portion, and a thickness of the first protective portion is not less than thicknesses of the welding ribbons. The front adhesive film and the back adhesive film are respectively connected to the front side and back side of the cell. The first plate and the second plate are connected to the front adhesive film and the back adhesive film, respectively.

16 Claims, 4 Drawing Sheets

(56)            References Cited

FOREIGN PATENT DOCUMENTS

| CN | 110137292 A | 8/2019 |
|----|-------------|--------|
| CN | 210897314 | 6/2020 |
| CN | 111755549 | 10/2020 |
| CN | 112216752 A | 1/2021 |
| CN | 112864265 | 5/2021 |
| CN | 114093967 | 2/2022 |
| CN | 216980579 | 7/2022 |
| WO | WO2013106896 A1 | 7/2013 |
| WO | WO2020177530 A1 | 9/2020 |
| WO | WO2021008474 A1 | 1/2021 |

OTHER PUBLICATIONS

Chinese Office Action for Application No. 202111552619.X dated Sep. 30, 2024.

International Search Report and Written Opinion (with English translations) for corresponding PCT Application No. PCT/CN2022/089995, mailed Jul. 25, 2022, 13 pages.

Chinese Office Action (w/English translation) for corresponding Application No. 202111552619, dated Mar. 25, 2025, 20 pages.

* cited by examiner

PHOTOVOLTAIC MODULE AND PREPARATION METHOD THEREFOR

CROSS-REFERENCE TO RELATED APPLICATIONS

This application is a national stage application of PCT international application No. PCT/CN2022/089995 filed on Apr. 28, 2022, which claims priority to Chinese patent application No. 202111552619X filed with the Chinese Patent Office on Dec. 17, 2021, entitled "PHOTOVOLTAIC MODULE AND PREPARATION METHOD THEREFOR", the entire contents of which are incorporated by reference.

TECHNICAL FIELD

The present disclosure relates to the photovoltaic technology, and in particular, to a photovoltaic module and a preparation method therefor.

BACKGROUND

In a photovoltaic module, cells in a cell string are connected through welding ribbons, and the cells are typically arranged with a negative spacing, that is to say, adjacent cells are partially overlapped, which makes it easy to cause the breakage of the cell, which in turn causes a short circuit in the module.

SUMMARY

According to an exemplary embodiment of the present disclosure, a photovoltaic module is provided. The photovoltaic module includes:

a cell string, where the cell string includes a plurality of cells, adjacent cells are connected in series through a plurality of spaced welding ribbons, an area on a surface of each cell without the welding ribbons is a mounting portion, and adjacent cells are staggered vertically;

transparent insulated flexible protectors, where the transparent insulated flexible protector is arranged on a front side or back side of each of the plurality of cells, each transparent insulated flexible protector includes a first protective portion connected to a surface of the mounting portion, and a thickness of the first protective portion is greater than or equal to the welding ribbons;

a front adhesive film and a back adhesive film connected to the front side and back side of the cells, respectively, one of the front adhesive film and the back adhesive film being connected to the transparent insulated flexible protectors; and a first plate and a second plate connected to the front adhesive film and the back adhesive film, respectively.

In a possible implementation, each first protective portion includes a plurality of groups of protective adhesives disposed between adjacent welding ribbons, the plurality of spaced welding ribbons each extend along a first preset direction. The plurality of groups of protective adhesives are distributed along a second preset direction. Each group of the second preset direction is not parallel to the first preset direction. The protective adhesive includes a plurality of adhesive bodies arranged at intervals.

In a possible implementation, the second preset direction is perpendicular to the first preset direction.

In a possible embodiment, each adhesive body is in a shape of a strip or dot.

In a possible implementation, a second protective portion connected to the first protective portion is also included for each cell. The second protective portion is disposed on the surfaces of the welding ribbons, and a surface of the second protective portion facing away from the welding ribbons is flush with a surface of the first protective portion facing away from the cell.

In a possible implementation, the surface of each transparent insulated flexible protector facing away from the cell is a curved surface.

In a possible implementation, a distance between edges of two adjacent cells that are close to each other is greater than zero.

In a possible implementation, the protective adhesive is hot melt adhesive or light-cured glue. A material of the protective adhesive is the same as that of the front adhesive film and the back adhesive film.

In a possible implementation, the first plate is used as an upper plate. The first plate is made of a transparent material. The second plate is used as a lower cover plate. The second plate is made of a multilayer polymer laminate or a metal plate.

According to an exemplary embodiment of the present disclosure, a preparation method for a photovoltaic module is provided. The preparation method includes stacking a first plate, a front adhesive film, a cell string, a transparent insulated flexible protective element, a back adhesive film, and a second plate, and then performing heating and laminating.

The cell string includes a plurality of cells. Adjacent cells are connected in series through a plurality of spaced welding ribbons. The area on the surface of each cell without the welding ribbons is a mounting portion. The adjacent cells are staggered vertically.

Each transparent insulated flexible protective element includes a first protective body, and a thickness of the first protective body is greater than or equal to thicknesses of the welding ribbons. The transparent insulated flexible protective element is stacked on a front side or back side of each of the plurality of cells, the first protective body is located at the mounting portion, and after the heating and laminating step, the first protective body forms the first protective portion.

The front adhesive film is stacked on a surface of the first plate and is located on the front side of the cells, and the back adhesive film is stacked on the back side of the cells.

The second plate is stacked on the side of the back adhesive film facing away from the cells.

In a possible implementation, the transparent insulated flexible protective element further includes a second protective portion, and the second protective portion is located on the surfaces of the welding ribbons. The first protective body includes a first protective layer and a second protective layer. The first protective layer and the second protective layer are connected. The second protective layer and the second protective portion are integrated. The first protective layer is arranged close to the surface of the cell.

After the heating and laminating process, the first protective layer is melted and adhered to the surface of the cell, and the first protective layer and the second protective layer together form the first protective portion.

In some embodiments, the second protective layer and the second protective portion are connected to the front adhesive film or the back adhesive film.

In a possible embodiment, the step of stacking the transparent insulated flexible protective element includes:

dispensing adhesive on the mounting portion on the front side or back side of the cell, and fixing the adhesive on the surface of the cell to form the first protective portion;

and/or, a distance between edges of adjacent cells that are close to each other is greater than or equal to zero.

BRIEF DESCRIPTION OF THE DRAWINGS

In order to illustrate the technical solutions of the embodiments of the present disclosure more clearly, the accompanying drawings required for describing the embodiments of the present disclosure will be briefly introduced below. It should be understood that the accompanying drawings merely show some embodiments of the present disclosure and therefore should not be considered as limiting the scope. For those of ordinary skill in the art, other relevant drawings can be obtained from these drawings without creative effort.

DETAILED DESCRIPTION OF THE EMBODIMENTS

In order to make the purpose, technical solutions, and advantages of the embodiments of the present disclosure more clear, the technical solutions of the embodiments of the present disclosure will be clearly and completely described below in conjunction with the accompanying drawings in the embodiments of the present disclosure. Obviously, the described embodiments are only some of the embodiments of the present disclosure, but not all of them. The components of the embodiments of the present disclosure described and illustrated in the accompanying drawings can be arranged and designed in various configurations.

Therefore, the detailed descriptions of the embodiments of the present disclosure provided in the accompanying drawings are not intended to limit the scope of the present disclosure to be protected, but merely represents the selected embodiments of the present disclosure. All other embodiments that are obtained based on the embodiments in the present disclosure by a person of ordinary skill in the art without creative effort fall within the protection scope of the present disclosure.

It should be noted that similar symbols and letters represent similar items in the following figures. Therefore, once an item is defined in one figure, it does not need to be further defined or explained in subsequent figures.

In the description of the present disclosure, it should be noted that the orientational or positional relationships indicated by the terms "above", "below", etc. is based on the orientational or positional relationship shown in the figures or the customary placement of the claimed product. These terms are only for the convenience of describing and simplifying the description of the present disclosure, and do not indicate or imply that the device or component referred to must have a specific orientation, be constructed and operated in a specific orientation. Therefore, these terms cannot be understood as limiting the present disclosure. In addition, terms such as "first", "second", etc. are only used to distinguish descriptions and cannot be understood as indicating or implying relative importance.

It should also be noted in the description of the present disclosure that unless otherwise clearly defined and limited, the terms "set" and "connect" should be interpreted broadly. For example, it may be a fixed connection, a detachable connection, or an integral connection. It may be a direct connection or an indirect connection through an intermediate medium. It may also be an interconnection between two components. For those of ordinary skill in the art, the specific meanings of these terms in the present disclosure can be understood based on specific situations.

Figure 1:
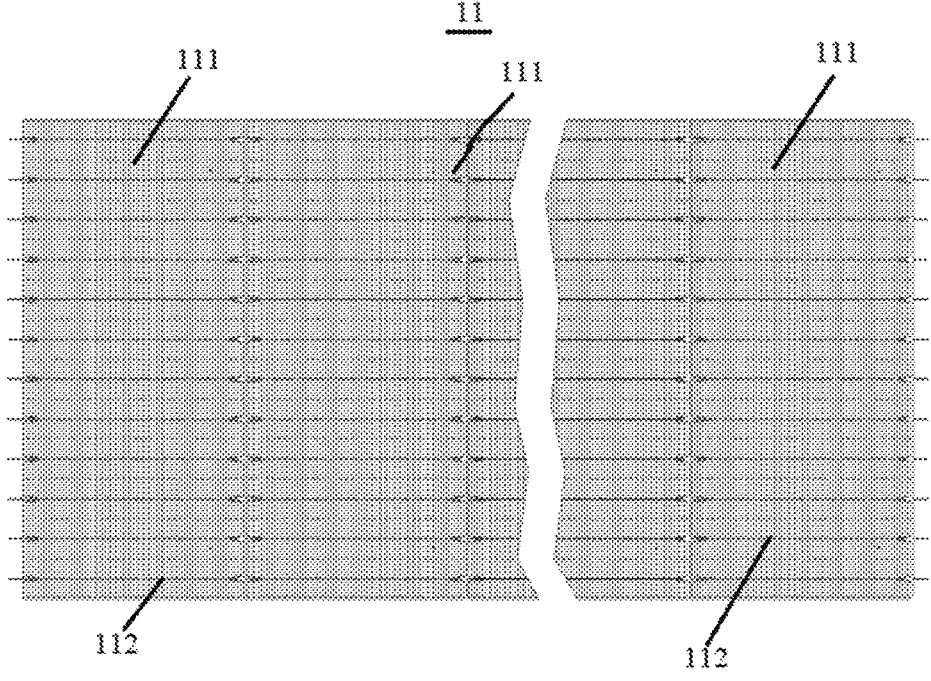
FIG. 1 is a schematic diagram of a cell string according to an exemplary embodiment of the present disclosure.
Figure 2:
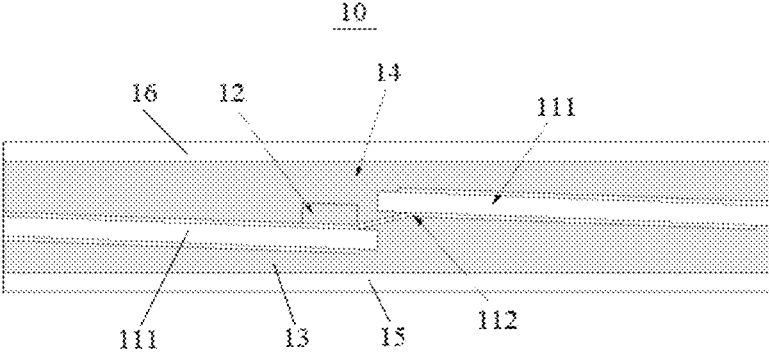
FIG. 2 is a schematic diagram illustrating a structure of a photovoltaic module according to an exemplary embodiment of the present disclosure.

According to an exemplary embodiment of the present disclosure, a photovoltaic module 10 (refer to FIG. 2) is provided, which includes a cell string 11 (refer to FIG. 1), transparent insulated flexible protectors 12, a front adhesive film 13, a back adhesive film 14, a first plate 15, and a second plate 16.

The cell string 11 includes a plurality of cells 111. Adjacent cells 111 are connected in series through a plurality of spaced welding ribbons 112, and adjacent cells 111 are staggered vertically. That is to say, the front surfaces of adjacent cells 111 are not flush with each other, and the back surfaces of adjacent cells 111 are not flush with each other. In some embodiments, the welding ribbon 112 is a tinned copper ribbon.

Figures 3, 4:
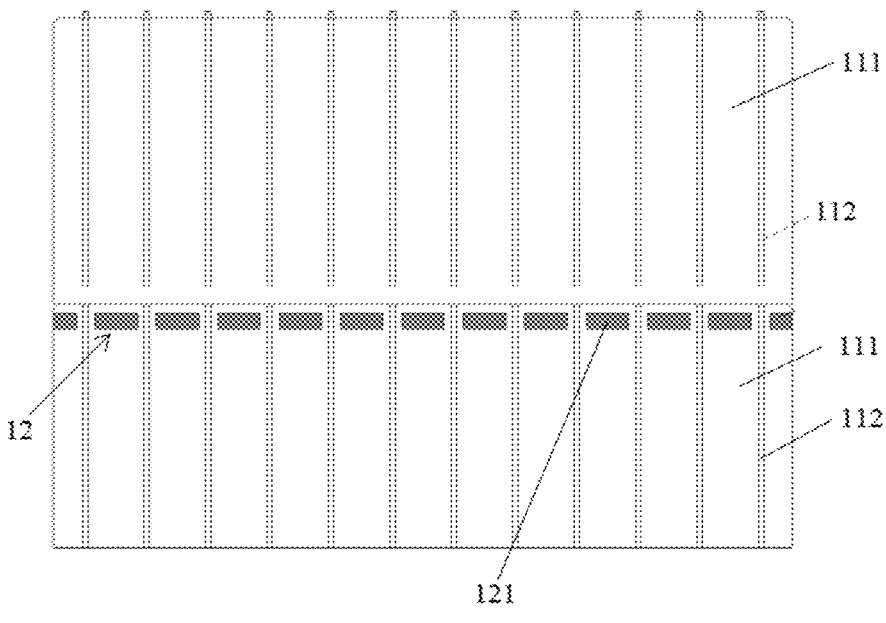
FIG. 3 is a schematic diagram illustrating a first structure of a cell string and a transparent insulated flexible protector according to an exemplary embodiment of the present disclosure.
FIG. 4 is schematic diagram illustrating a second structure of a cell string and a transparent insulated flexible protector according to an exemplary embodiment of the present disclosure.
Figure 5:
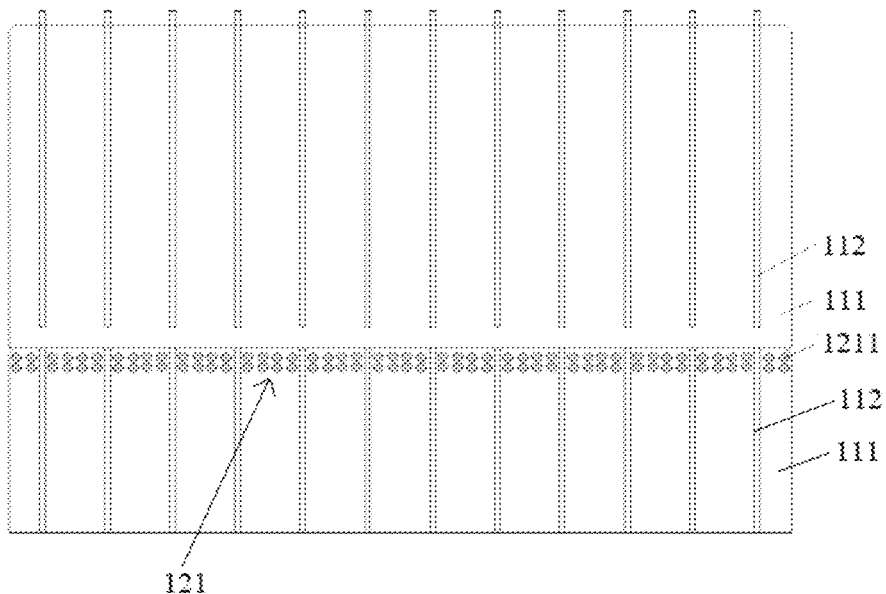
FIG. 5 is a schematic diagram illustrating a third structure of a cell string and a transparent insulated flexible protector according to an exemplary embodiment of the present disclosure.

The transparent insulated flexible protector 12 is arranged on the front side or the back side of each of the plurality of cells 111. The area on the surface of each cell 111 without the welding ribbons 112 is a mounting portion. The transparent insulated flexible protector 12 includes a first protective portion 121 (refer to FIG. 3 to FIG. 5) connected to the surface of the mounting portion. The thickness of the first protective portion 121 is greater than or equal to the thickness of the welding ribbons 112. Since the transparent insulated flexible protector 12 is transparent, it will not block the cell 111 and will not affect the power generation efficiency of the cell 111.

The front adhesive film 13 and the back adhesive film 14 are connected to the front side and back side of each cell 111, respectively. One of the front adhesive film 13 and the back adhesive film 14 is connected to the transparent insulated flexible protectors 12. It should be noted that if the transparent insulated flexible protectors 12 are disposed on the front sides of the cells 111, respectively, the front adhesive film 13 is connected to the transparent insulated flexible protectors 12. If the transparent insulated flexible protectors 12 are disposed on the back sides of the cells 111, respectively, the back adhesive film 14 is connected to the transparent insulated flexible protectors 12.

The adjacent cells 111 can be insulated by the front adhesive film 13 and the back adhesive film 14 since the adjacent cells 111 are staggered vertically, which can reduce the risk of a short circuit in the photovoltaic module 10.

In some embodiments, the distance between the edges of adjacent cells 111 that are close to each other is greater than or equal to zero, and the adjacent cells 111 are staggered vertically, so that the adjacent cells 111 do not contact, further reducing the risk of a short circuit.

In related technologies, cells are arranged with a negative spacing, that is, they are partially overlapped. The purpose of doing so is to increase the arrangement density of the cells in the cell string, thereby increasing the power generation of photovoltaic module. However, the inventors of the present disclosure have found during research that the cells are blocked at the overlapping areas, resulting in a reduction in the light receiving area of the cells, which will affect the efficiency of the cell module.

In the above technical solution, since the distance between the edges of adjacent cells that are close to each other is greater than or equal to zero and the adjacent cells are staggered vertically, the adjacent cells will not contact, further reducing the risk of short circuit. In addition, there is no obstruction between the cells, which can improve the efficiency of the cell module.

The first plate 15 and the second plate 16 are connected to the front adhesive film 13 and the back adhesive film 14 respectively. The first plate 15 is used as the upper plate, and the first plate 15 is made of a transparent material, such as glass. The second plate 16 used as the lower cover plate may be a glass plate, a multilayer polymer laminate, a metal plate, etc.

In the photovoltaic module 10 of this embodiment, the transparent insulated flexible protector 12 is provided on the front side or back side of each of the plurality of cells 111, and the first protective portion 121 of the transparent insulated flexible protector 12 is connected to the surface of the mounting portion of the cell 111. The thickness of the first protective portion 121 is greater than or equal to the thickness of the welding ribbons 112. In this way, the transparent insulated flexible protector 12 avoids the welding strips 112. During the process of forming the photovoltaic module 10 through lamination, the first protective portion 121 forms a support on both sides of the welding ribbons 112 to reduce the stress on the welding ribbons 112. In addition, the transparent insulated flexible protector 12 is flexible. Therefore, the probability of breakage of the cell 111 is reduced, and the risk of a short circuit in the module is reduced.

Exemplarily, the thickness of the first protective portion 121 is greater than the thickness of the welding ribbon 112 by 0.05-0.1 mm, such as 0.05 mm, 0.06 mm, 0.07 mm, 0.08 mm, 0.09 mm, or 0.1 mm.

In a possible implementation, the first protective portion 121 includes a plurality of groups of protective adhesives disposed between adjacent welding ribbons 112. The plurality of spaced welding ribbons 112 each extend along a first preset direction, and the plurality of groups of protective adhesives are distributed along a second preset direction. The second preset direction is not parallel to the first preset direction. In some embodiments, each group of the protective adhesives include a plurality of adhesive bodies 1211 arranged at intervals. In some embodiments, the second preset direction is perpendicular to the first preset direction.

The protective adhesives can be well fixed with the cell 111, and the adhesive bodies 1211 of the protective adhesives can form flexible support on both sides of the welding ribbons 112, thereby reducing the probability of breakage of the cells 111. In some embodiments, each adhesive body 1211 is in the shape of a strip or dot. In addition, the plurality of spaced adhesive bodies 1211 may also be arranged along the second preset direction.

Exemplarily, the protective adhesive may be hot melt adhesive or light-curing adhesive. Hot melt adhesive can be cured after heating. The light-curing adhesive can be cured by light. The material of the protective adhesive can be the same as the material of the adhesive films. For example, the hot melt adhesive may be Ethylene Vinyl Acetate (EVA) or Polyolefin Elastomer (POE).

Figure 6:
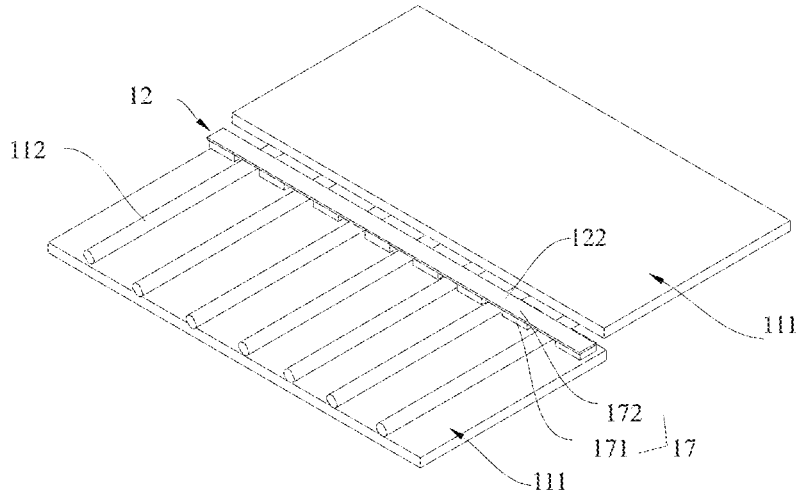
FIG. 6 is a schematic diagram illustrating positions of a first protective body and a second protective portion in a cell string according to another exemplary embodiment of the present disclosure.

In another possible implementation, each transparent insulated flexible protector 12 also includes a second protective portion 122 connected to the first protective portion 121 (refer to FIG. 6). The second protective portion 122 is disposed on the surfaces of the welding ribbons 112. The surface of the second protective portion 122 facing away from the welding ribbons 112 is flush with the surface of the first protective portion 121 facing away from the cell 111. The second protective portion 122 will bear a certain pressure during the lamination process. Since the surface of the second protective portion 122 facing away from the welding ribbons 112 is flush with the surface of the first protective portion 121 facing away from the cell 111, the force is relatively uniform on the surface of the welding ribbons 112 and the surface of the mounting portion, thereby reducing the probability of breakage of the cell 111.

Exemplarily, the surface of the transparent insulated flexible protector 12 facing away from the cell 111 is flat. It can be understood that the surface of the transparent insulated flexible protector 12 facing away from the cell 111 may also be a curved surface. It should be noted that when the surface of the transparent insulated flexible protector 12 facing away from the cell 111 is a curved surface, the magnitude of the protrusions and depressions of the surface of the second protective portion 122 facing away from the cell 111 is consistent with the magnitude of the protrusions and depressions of the surface of the first protective portion 121 facing away from the cell 111.

Exemplarily, the transparent insulated flexible protector has a width of no more than 50 mm, for example, any of 5 mm, 10 mm, 20 mm, 30 mm, 40 mm, and 50 mm, or a range between any two of them.

According to another exemplary embodiment of the present disclosure, a preparation method for the above-mentioned photovoltaic module 10 is provided. The method includes stacking the first plate 15, the front adhesive film 13, the cell string 11, transparent insulated flexible protective elements, the back adhesive film 14 and the second plate 16, and then performing heating and laminating.

The cell string 11 includes a plurality of cells 111. Adjacent cells 111 are connected in series through a plurality of spaced welding ribbons 112. The area on the surface of each cell 111 without the welding ribbons 112 is a mounting portion. Adjacent cells 111 are staggered vertically.

Figure 7:
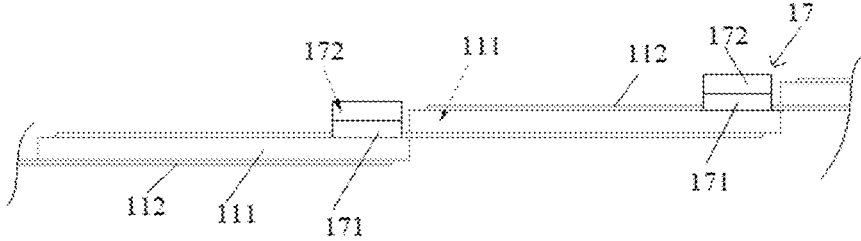
FIG. 7 is a schematic diagram illustrating the positions of the first protective body and the second protective portion in the cell string in another perspective according to another exemplary embodiment of the present disclosure.

Each transparent insulated flexible protective element includes a first protective body 17 (refer to FIG. 6 and FIG. 7). The thickness of the first protective body 17 is greater than or equal to the thickness of the welding ribbons 112. The transparent insulated flexible protector 12 is stacked on the front side or the back side of the cell 111, and the first protective body 17 is located at the mounting portion. After the heating and laminating process, the first protective body 17 forms the first protective portion 121.

The front adhesive film 13 is stacked on the surface of the first plate 15 and is located on the front sides of the cells 111. The back adhesive film 14 is stacked on the back sides of the cells 111. The second plate 16 is stacked on the surface of the back adhesive film 14 facing away from the cell 111.

The first plate 15, the front adhesive film 13, the cell string 11, the transparent insulated flexible protective elements, the back adhesive film 14, and the second plate 16 are stacked. Each transparent insulated flexible protective element is stacked on the front side or back side of the cell 111, and the first protective body 17 is located at the mounting portion. In this way, during the heating and laminating process, the first protective body 17 forms support on both sides of the welding ribbons 112, reducing the stress on the welding ribbons 112. In addition, the transparent insulated flexible protective element is flexible. Therefore, the probability of breakage of the cells 111 is reduced, and the risk of a short circuit in the module is reduced. After the heating and lamination process, the first protective body 17 forms the first protective portion 121 and is connected to the surface of the mounting portion of the cell 111. Moreover, adjacent cells 111 are staggered vertically, and the front adhesive film 13 and the back adhesive film 14 are melted and filled between the adjacent cells 111 so as to insulate the adjacent cells 111 after the heating and laminating, further reducing the risk of the short circuit in the photovoltaic module 10. It should be noted that, before and after the heating and laminating, adjacent cells 111 are staggered in different degrees.

In some embodiments, a second protective portion 122 is also included for each of the plurality of cells 111. The second protective portion 122 is located on the surface of the welding ribbons 112. The first protective body 17 includes a first protective layer 171 and a second protective layer 172. The first protective layer 171 and the second protective layer 172 are connected. The second protective layer 172 and the second protective portion 122 are integrated, and the first protective layer 171 is disposed close to the surface of the cell 111. After the heating and laminating process, the first protective layer 171 is melted and adhered to the surface of the cell 111, and the first protective layer 171 and the second protective layer 172 together form the first protective portion 121. For example, the first protective layer 171 is an EVA film. The second protective layer 172 is a Polyethylene Terephthalate (PET) film.

During the heating and laminating process, the first protective layer 171 is melted and adhered to the surface of the cell 111, and the first protective portion 121 formed by the first protective layer 171 and the second protective layer 172 together exerts a force on the mounting portion of the cell 111, and the second protective portion 122 exerts a force on the welding ribbons 112. The cell 111 is subjected to a relative uniform force and thus is less likely to break.

The second protective layer 172 and the second protective portion 122 may be pre-connected to the adhesive film. The transparent insulated flexible protector 12 is stacked on the front side of the cell 111 if the second protective layer 172 and the second protective portion 122 are pre-connected to the front adhesive film 13. The transparent insulated flexible protector 12 is stacked on the back side of the cell 111 if the second protective layer 172 and the second protective portion 122 are pre-connected to the back adhesive film 14.

In another possible implementation, the step of stacking the transparent insulated flexible protective element includes dispensing adhesive on the mounting portion on the front side or back side of the cell 111, and fixing the adhesive on the surface of the cell 111 to form the first protective portion 121. The structure of the first protective portion 121 formed by this method has been introduced in the above embodiments and will not be repeated herein.

If it is desired to arrange the transparent insulated flexible protective element on the back side of the cell 111, the step of stacking the first plate 15, the front adhesive film 13, the cell string 11, the transparent insulated flexible protective elements, the back adhesive film 14, and the second plate 16 includes:

stacking the front adhesive film 13 on the surface of the first plate 15;

stacking the cell string 11 on the surface of the front adhesive film 13 so that the front sides of the cells 111 are in contact with the front adhesive film 13;

placing the second protective portion 122 and the first protective body 17 on the back side of each cell 111 correspondingly, or dispensing adhesive on the mounting portion on the back side of each cell 111;

placing the back adhesive film 14 on the surface of the first protective body 17 away from the back side of each cell 111; and stacking the second plate 16 on the surface of the back adhesive film 14 and performing laminating.

The above are only preferred embodiments of the present disclosure and are not intended to limit the present disclosure. For those skilled in the art, the present disclosure may have various modifications and changes. Any modifications, equivalent substitutions, improvements, etc. made within the spirit and principles of this disclosure shall be included in the protection scope of this disclosure.

INDUSTRIAL APPLICABILITY

The present disclosure provides a photovoltaic module and a preparation method therefor, which relate to the field of photovoltaic technology. The photovoltaic module includes a cell string, transparent insulated flexible protectors, a front adhesive film, a back adhesive film, a first plate and a second plate. The cell string includes a plurality of cells. Adjacent cells are connected in series through a plurality of spaced welding ribbons. The area on the surface of each cell without the welding ribbons is a mounting portion. Adjacent cells are staggered vertically. The transparent insulated flexible protector is provided on the front side or back side of each of the plurality of cells. The transparent insulated flexible protector includes a first protective portion connected to the surface of the mounting portion. The thickness of the first protective portion is greater than or equal to the thickness of the welding ribbons. The front adhesive film and the back adhesive film are respectively connected to the front side and back side of the cell, and one of the front adhesive film and the back adhesive film is connected to the transparent insulated flexible protectors. The first plate and the second plate are connected to the front adhesive film and the back adhesive film, respectively. In this way, the cell breakage can be reduced.

Furthermore, it can be understood that the photovoltaic module and the preparation method therefor provided in the present disclosure are reproducible and can be applied in a variety of industrial applications. For example, the photovoltaic module of the present disclosure can be applied in the field of photovoltaic technology.

What is claimed is:

1. A photovoltaic module, comprising:

a cell string, comprising a plurality of cells, adjacent cells being connected in series through a plurality of spaced welding ribbons, an area on a surface of each cell without the welding ribbons being a mounting portion, the adjacent cells being staggered vertically;

transparent insulated flexible protectors, the transparent insulated flexible protectors being arranged on a front side or back side of each of the plurality of cells, each transparent insulated flexible protector comprising a first protective portion and a second protective portion connected to the first protective portion, the first protective portion being disposed on the area of the surface of the cell without the welding ribbons to form a support on both sides of the welding ribbons, the second protective portion being disposed on the surfaces of the welding ribbons, a thickness of the first protective portion being greater than or equal to thicknesses of the welding ribbons, wherein a first protective layer and a second protective layer together form the first protective portion, the first protective layer connected to the mounting portion is an Ethylene Vinyl Acetate (EVA) film, the second protective layer is a Polyethylene Terephthalate (PET) film, the first protective layer and the second protective layer are connected, and the second protective layer and the second protective portion are integrated;

a front adhesive film and a back adhesive film, connected to the front sides and back sides of the cells, respectively, one of the front adhesive film and the back adhesive film being connected to the transparent insulated flexible protectors; and a first plate and a second plate, connected to the front adhesive film and the back adhesive film, respectively.

2. The photovoltaic module according to claim 1, wherein each first protective portion comprises a plurality of groups of protective adhesives disposed between adjacent welding ribbons, the plurality of spaced welding ribbons each extend along a first preset direction, the plurality of groups of the protective adhesives are distributed along a second preset direction, and the second preset direction and the first preset direction are not parallel.

3. The photovoltaic module according to claim 2, wherein each group of the protective adhesive comprises a plurality of adhesive bodies arranged at intervals.

4. The photovoltaic module according to claim 3, wherein each adhesive body is in a shape of a strip or dot.

5. The photovoltaic module according to claim 2, wherein the second preset direction is perpendicular to the first preset direction.

6. The photovoltaic module according to claim 2, wherein the protective adhesive is hot melt adhesive or light-cured adhesive.

7. The photovoltaic module according to claim 6, wherein a material of the protective adhesive is the same as that of the front adhesive film and the back adhesive film.

8. The photovoltaic module according to claim 1, wherein a surface of the second protective portion facing away from the welding ribbons is flush with a surface of the first protecting portion facing away from the cell.

9. The photovoltaic module according to claim 8, wherein a surface of the transparent insulated flexible protector facing away from the cell is a curved surface.

10. The photovoltaic module according to claim 1, wherein a distance between edges of adjacent cells that are close to each other is greater than zero.

11. The photovoltaic module according to claim 1, wherein the first plate is used as an upper plate, the first plate is made of a transparent material, the second plate is used as a lower cover plate, and the second plate is a multilayer polymer laminate or a metal plate.

12. A preparation method for a photovoltaic module, comprising:

stacking a first plate, a front adhesive film, a cell string, transparent insulated flexible protective elements, a back adhesive film, and a second plate, and then performing heating and laminating;

wherein the cell string comprises a plurality of cells, adjacent cells being connected in series through a plurality of spaced welding ribbons, an area on a surface of each of the plurality of cells without the welding ribbons being a mounting portion, the adjacent cells being staggered vertically;

wherein each transparent insulated flexible protective element comprises a first protective body and a second protective portion, a thickness of the first protective body being greater than or equal to thicknesses of the welding ribbons; the transparent insulated flexible protective element is stacked on a front side or back side of each of the plurality of cells, the first protective body is located at the area without the welding ribbons to form a support on both sides of the welding ribbons, and the first protective body comprises a first protective layer and a second protective layer, the first protective layer and the second protective layer are connected, the second protective layer and the second protective portion are integrated, the first protective layer is disposed close to a surface of the cell, after the heating and laminating process, the first protective layer is melted and adhered to the surface of the cell, and the first protective layer and the second protective layer together form a first protective portion, the second protective portion is connected to the first protective portion, and the second protective portion is disposed on the surfaces of the welding ribbons, wherein the first protective layer is an EVA film, and the second protective layer is a PET film; and wherein the front adhesive film is stacked on a surface of the first plate and is located on the front side of the cells, the back adhesive film is stacked on the back side of the cells, and the second plate is stacked on a surface of the back adhesive film facing away from the cells.

13. The preparation method for the photovoltaic module according to claim 12, wherein the second protective layer and the second protective portion are connected to the front adhesive film or the back adhesive film.

14. The preparation method according to claim 13, wherein the second protective layer and the second protective portion are pre-connected to the front adhesive film or the back adhesive film.

15. The preparation method for the photovoltaic module according to claim 12, wherein a step of stacking the transparent insulating flexible protective element includes:

dispensing adhesive on the mounting portion on the front side or back side of the cell, and fixing the adhesive on the surface of the cell to form the first protective portion;

and/or, a distance between edges of adjacent cells that are close to each other is greater than or equal to zero.

16. The preparation method according to claim 12, wherein the stacking the first plate, the front adhesive film, the cell string, the transparent insulated flexible protective elements, the back adhesive film, and the second plate comprises:

stacking the front adhesive film on a surface of the first plate;

stacking the cell string on a surface of the front adhesive film so that front sides of the cells are in contact with the front adhesive film;

placing the second protective portion and the first protective body on a back side of each cell correspondingly, or dispensing adhesives on the mounting portion on the back side of each cell;

placing the back adhesive film on a surface of the first protective body away from the back side of each cell; and stacking the second plate on a surface of the back adhesive film and performing laminating.

* * * * *